United States Patent [19]
Bojer

[11] Patent Number: 6,029,059
[45] Date of Patent: Feb. 22, 2000

[54] QUADRATURE MIXER METHOD AND APPARATUS

[75] Inventor: Jorgen Bojer, Fleetwood, Pa.

[73] Assignee: Lucent Technologies, Inc., Murray Hill, N.J.

[21] Appl. No.: 08/884,807

[22] Filed: Jun. 30, 1997

[51] Int. Cl.[7] .................................................. H04B 1/26
[52] U.S. Cl. ........................ 455/326; 455/333; 455/327; 327/361
[58] Field of Search .................................... 455/333, 327, 455/302, 324, 326; 327/361, 355, 357

[56] References Cited

U.S. PATENT DOCUMENTS

| | | | |
|---|---|---|---|
| 4,313,089 | 1/1982 | Predina | 328/155 |
| 5,448,772 | 9/1995 | Grandfield | 455/326 |
| 5,630,228 | 5/1997 | Mittel | 455/326 |
| 5,642,071 | 6/1997 | Sevenhans et al. | 327/357 |
| 5,805,988 | 9/1998 | Clayton et al. | 455/333 |
| 5,809,410 | 9/1998 | Stuebing et al. | 455/333 |

FOREIGN PATENT DOCUMENTS

| | | |
|---|---|---|
| 1-188006 | 7/1989 | Japan . |
| 4-343505 | 11/1992 | Japan . |

*Primary Examiner*—Reinhard J. Eisenzopf
*Assistant Examiner*—Darnell R. Armstrong
*Attorney, Agent, or Firm*—Synnestvedt & Lechner LLP

[57] ABSTRACT

A quadrature mixer architecture that mixes the in-phase and quadrature phases within the same cell. The input voltage is applied to the base of a voltage conversion transistor, which converts the input voltage into a bias current on the collector of the voltage conversion transistor. Four mixer transistors have their emitters connected to the collector of the drive transistor so as to receive the bias current. The bases of a first pair of the upper transistors are fed with the in-phase components (e.g., 0 and 180°), while the bases of the other pair of transistors are fed with the quadrature phase components (e.g., 90 and −90° of a local oscillator). The collectors of the mixer transistors are taken as the four output components of the circuit, $I_{out}$, $I_{out\_}$, $Q_{out}$, and $Q_{out\_}$.

9 Claims, 6 Drawing Sheets

QUADRATURE MIXER METHOD AND APPARATUS

FIELD OF THE INVENTION

The invention pertains to quadrature mixers for mixing the in-phase and quadrature phase portions of a signal.

BACKGROUND OF THE INVENTION

The present invention pertains to quadrature mixers of the type in which an input signal is mixed with a quadrature local reference signal. The invention does not pertain to quadrature mixers of the type where the input signal itself is also quadrature. Quadrature mixers of the variety to which the present invention pertains, have many potential practical applications, including integrated circuits and modules for radio frequency receivers, and other wireless communications products. They are, for instance, employed in single side-band mixers and quadrature demodulators and modulators.

Single side-band mixers are used in cellular telephone technology for heterodyning an incoming radio frequency (RF) cellular telephone signal down to an intermediate frequency. The use of a single side-band mixer employing a quadrature mixer for this purpose performs two functions which otherwise would need to be performed by separate circuits. In particular, a single side-band mixer using a quadrature mixer not only performs heterodyning, but also can be used to image reject one side-band of a double side-band (DSB) input signal.

Because the frequency ranges dedicated to cellular telephone communications have rapidly become overloaded with communication traffic, both the United States and Europe have recently added new band ranges dedicated for cellular telephone communications. Particularly, the U.S. has added 1900 megahertz as a second cellular telephone communication band to the previously existing 800 MHz range. In Europe, where 900 megahertz is dedicated to cellular telephone communications, 1800 megahertz has been added as a second frequency for cellular telephone communications.

In view of these new bands for cellular telephone communications, there is a need for cellular telephones which can receive signals at two separate carrier frequencies, e.g., in the U.S., 800 megahertz and 1900 megahertz.

One way to provide such functionality in a cellular telephone is to provide two sets of receive circuit paths, one for each of the two possible carrier frequencies.

However, at the same time that these new band widths for cellular telephone communication are being opened, there is the ever-present drive to reduce the size of electronic devices, including cellular telephones. Accordingly, the solution of simply adding a second receiver path is undesirable since it significantly increases the circuitry in the telephone, and thus the telephone's size.

Therefore, it is desirable to reduce the size of the circuits needed in the telephone in order to perform the necessary functions. It also is desirable to provide a single circuit which can perform the same function at two different frequencies in order to reduce the overall amount of circuitry needed to accommodate both frequency ranges.

SUMMARY OF THE INVENTION

The invention comprises a new quadrature mixer architecture. Particularly, the architecture comprises four upper transistors arranged in two pairs. The emitters of all four upper transistors are coupled together and connected to the collector of a single lower drive transistor. The base of the lower drive transistor is connected to the input signal voltage. Alternately, in a common base embodiment of the invention, the input signal may be coupled to the emitter of the drive transistor. The lower transistor converts the input voltage to a bias current on the collector of the lower drive transistor. The bases of the four upper transistors are coupled to the in-phase, complementary in-phase, quadrature, and complementary quadrature components of a local oscillator, respectively. Each of the four upper transistors mixes the bias current with the four aforementioned orthogonal components of the local oscillator current, thus producing at the collectors of the four upper transistors, the products of the input voltage mixed with the four orthogonal components of the local oscillator.

The four output signals of the new quadrature mixer can be recombined in a manner so as to cancel out one side of a double side band input signal. Therefore, it can be used in a single side-band mixer to achieve both heterodyning and image rejection with respect to a double side-band input signal.

DETAILED DESCRIPTION OF A PREFERRED EMBODIMENTS OF THE INVENTION

Figure 1:
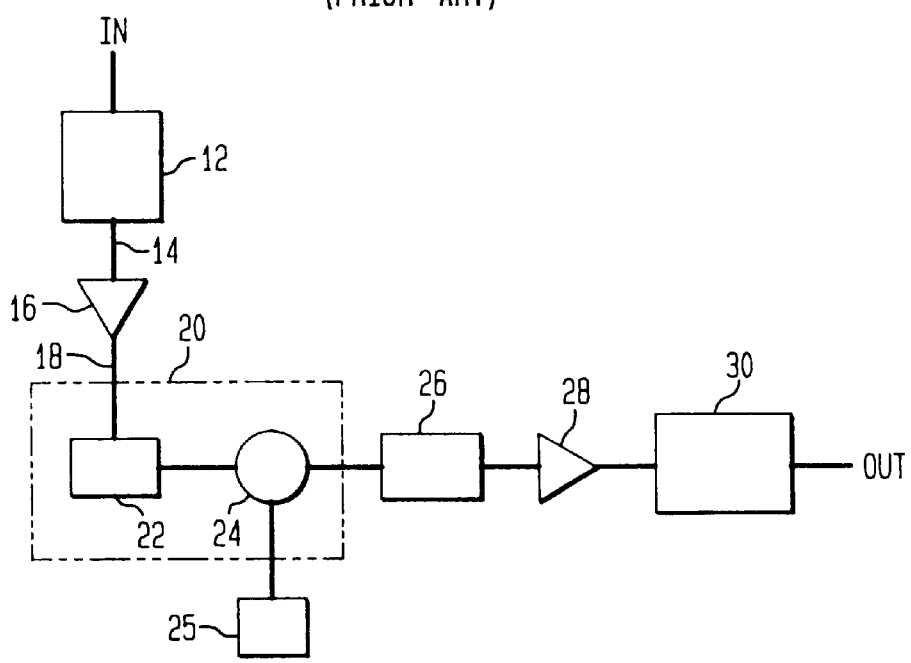
FIG. 1 is a block diagram illustrating a conventional receive data path for a radio frequency signal, such as might be found in a cellular telephone receiver.

Referring to FIG. 1, which shows a typical receive path of a cellular telephone, the incoming signal is passed through a high frequency filter 12 in order to eliminate any noise or other signals not near 800 megahertz. The filtered signal 14 is then passed through a low noise amplifier 16 in order to boost signal strength. The output 18 of the low noise amplifier is then fed to a frequency down converter 20.

The down converter 20 frequency shifts the information content of the input signal and eliminates one of the side bands of a double side band (DSB) input signal. FIG. 1 illustrates one possible frequency down converter comprising an image reject filter 22 which filters for only one of the side bands and a DSB mixer 24 that mixes the input signal with a signal from a local oscillator 25. This creates an output signal having components at the sum and difference frequencies of the two signals, $F_{in} \pm F_{lo}$. A typical local oscillator may to tuned to 870 MHz, for example. Therefore, the output of the SSB mixer has signal components at 70 MHz and 1670 MHz.

An intermediate frequency filter 26 follows the SSB mixer and filters for one of the frequencies $F_{in} \pm F_{lo}$. Typically this will be the difference frequency, e.g., 70 MHz, since it is easier and less expensive to work with lower frequencies rather than higher frequencies. The output of the intermediate frequency filter 26 is provided through another amplifier 28 to a further mixer 30 which takes the intermediate frequency signal and converts it to the base band frequency, e.g., 0 Hz to 5 KHz, which can be output to the telephone handset speaker to reproduce the data, e.g., a voice.

Figure 2:
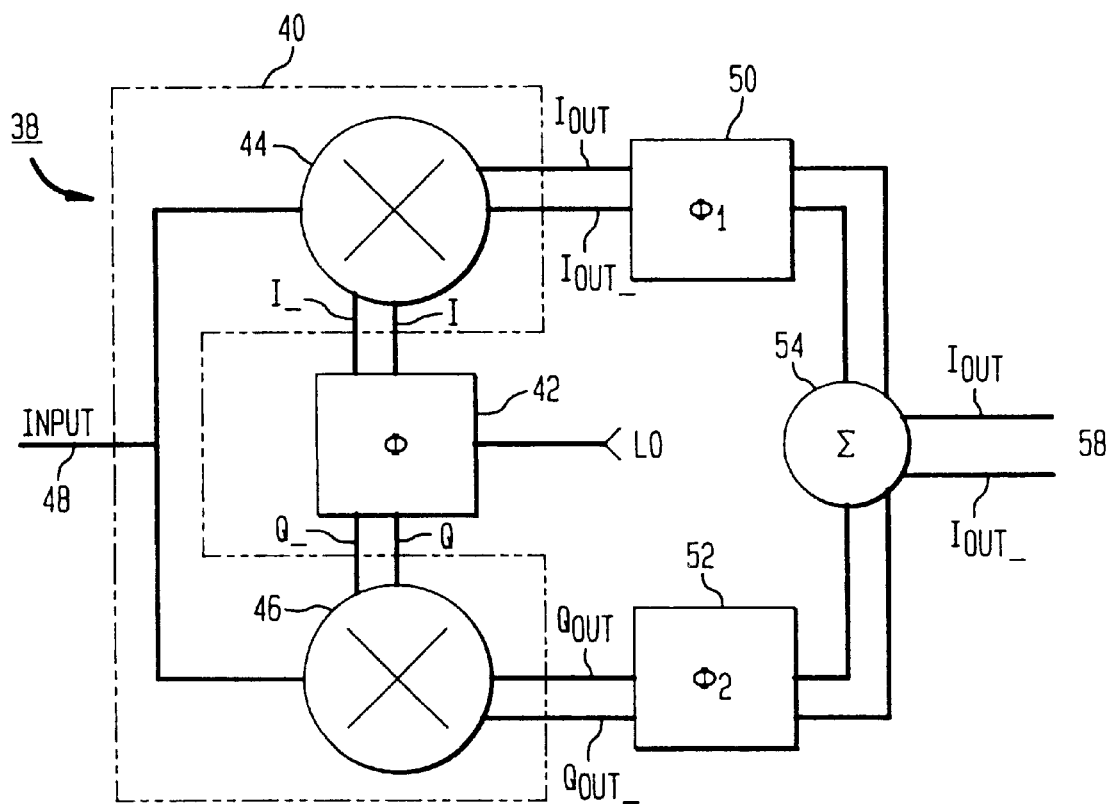
FIG. 2 is a block diagram of a single side-band mixer employing a conventional quadrature mixer that can be used as the single side band mixer shown in FIG. 1.

One may use a Single Side-Band (SSB) mixer 38 as shown in FIG. 2 as a substitute for the frequency down converter 20 discussed above in connection with FIG. 1. An SSB mixer is advantageous since it eliminates the need for the image reject filter and because one such mixer can be adapted to operate in two separate frequency ranges with minimal additional circuitry.

FIG. 2 is a block diagram of an exemplary single sideband mixer 38 of the prior art employing a quadrature mixer 40 which can replace the frequency down converter of FIG. 1. The circuit comprises a quadrature mixer 40 in combination with a phase splitter 42, two phase shifters 50 and 52, and a summation circuit 54. In a dual balanced mixer as shown in FIG. 2, the quadrature mixer 40 comprises two mixers 44 and 46, which can be Gilbert cells. The input signal 48, at a carrier frequency, for example, of 800 MHz, is split and fed into each quadrature mixer 44 and 46. A local oscillator signal 50 at, for example, 870 megahertz is provided to phase splitter 42. The phase splitter splits the local oscillator signal 50 into its orthogonal components, I at 0°, I__ at 180°, Q at 90° and Q__ at −90°. The in-phase signal, I, and its complement, I__, are fed into one of the mixers 44, while the quadrature signal, Q, and its complement, Q__, are fed into the other mixer 46. The mixers mix the local oscillator signals with the input signal and produce four orthogonal output signal components, each having a frequency component at the intermediate frequency, i.e., 70 megahertz, as well as other frequencies. Specifically, quadrature mixer 44 produces an in-phase signal output, $I_{out}$, and its complement, $I_{out\_}$ while mixer 46 produces a quadrature signal, $Q_{out}$, and its complement, $Q_{out\_}$.

These four output signals can be phase shifted and recombined in a manner that is well known in the art such that one side-band of a double side-band input signal is canceled out, while the other side-band remains. This eliminates the need for a separate image reject filter.

Phase shifter 50 phase shifts the $I_{out}$ and $I_{out\_}$ signals by 90°, while phase shifter 52 shifts the $Q_{out}$ and $Q_{out\_}$ signals by −90°. The four phase shifted output signals of phase shifters 50 and 52 are then recombined by a summation circuit 54 configured to recombine the output signals in any one of a number of ways to achieve the specific output signal(s) 58 desired for the particular application.

Further, as shown in FIG. 1, the 70 MHz signal can be isolated by subsequent filtering of the combined output signal. A quadrature mixer such as illustrated in FIG. 2 may be used as a replacement for both the frequency down converter 20 and base band mixer 30 of the receive circuitry of FIG. 1.

Figure 3:
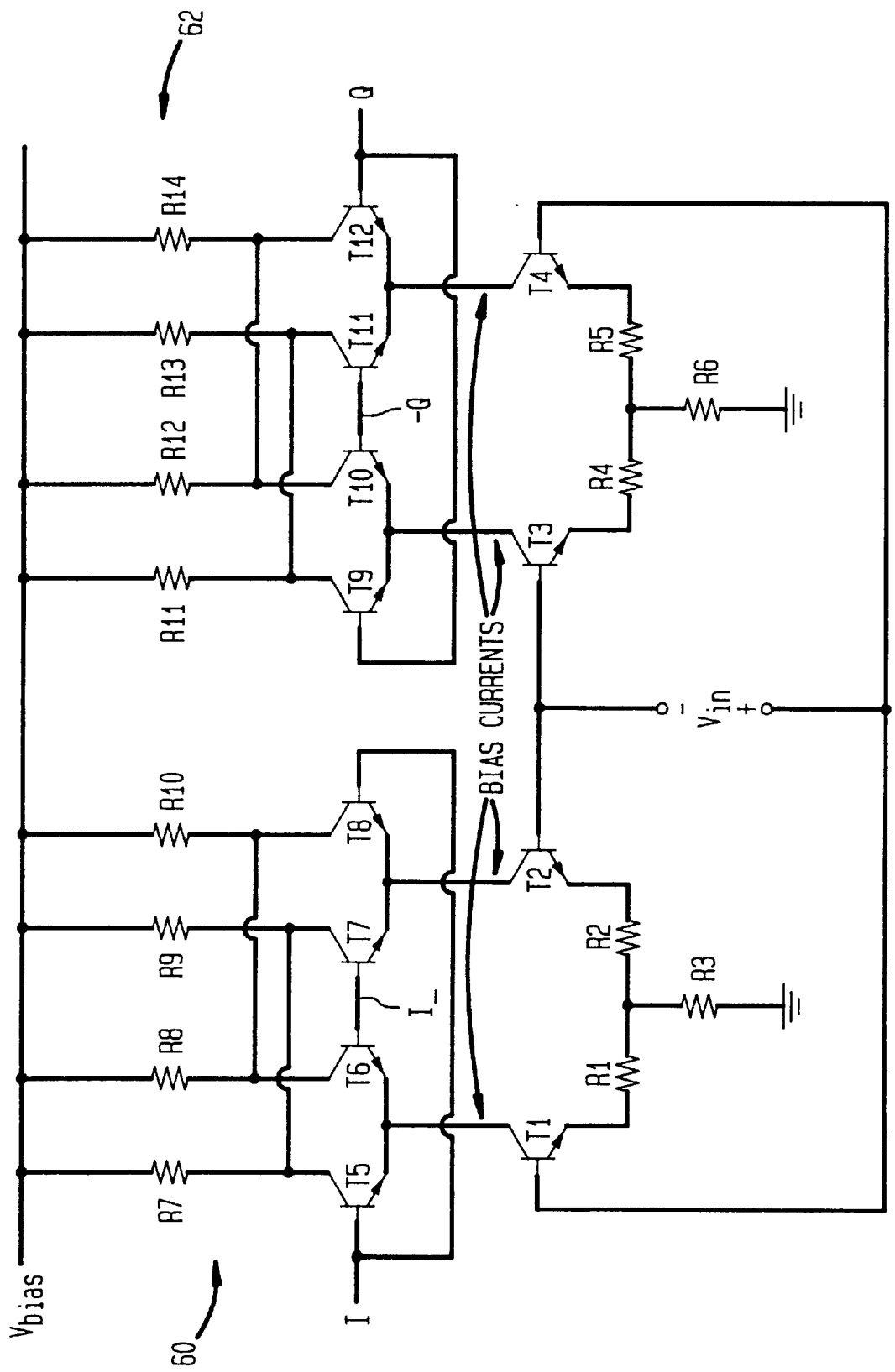
FIG. 3 is a circuit diagram of a conventional dual balanced quadrature mixer which might be used in the single side-band mixer of FIG. 2.

FIG. 3 is a circuit diagram of an exemplary dual balanced quadrature mixer, such as quadrature mixer 40 of FIG. 2.

One end of the dual balanced input voltage is provided to the bases of transistors T1 and T4 and the other end of the input voltage is provided to the bases of transistors T2 and T3. The emitters of transistors T1 and T2 are fed to ground through impedances R1, R2 and R3, as shown. The emitters of transistors T3 and T4 are fed to ground through impedances R4, R5 and R6, as shown. Transistors T1–T4 essentially operate as voltage to current converters, creating bias currents on the collector terminals of the transistors T1–T4 proportional to the input voltage. These collector currents are mixed with the local oscillator current in two separate Gilbert cells 60 and 62.

In particular, the in-phase local oscillator current, I, is provided to the bases of transistors T5 and T8. The complement of the in-phase local oscillator current, I__, is provided to the bases of transistors of T6 and T7. The quadrature local oscillator current is provided to the bases of T9 and T12. The complement of the quadrature local oscillator current, Q__, is provided the bases of transistors T10 and T11.

As can be seen, the bias current from the collector of transistor T1 (representing the positive end of the input voltage) is split and applied to the emitters of transistors T5 and T6, and the bias current from the collector of transistor T4 (also representing the positive end of the input voltage) is split and applied to the emitters of transistors T11 and T12. The bias current from the collector of transistor T2 (representing the negative end of the input voltage) is split and applied to the emitters of transistors T7 and T8, and the bias current from the collector of transistor T3 (also representing the negative end of the input voltage) is split and applied to the emitters of transistors T9 and T10. The bias currents are not affected by the current at the bases of transistors T5–T12, but only by the input voltage at the bases of transistors T1–T4. Accordingly, the current at the collectors of transistors T5–T12 are the various products (or mixtures) of the particular orthogonal component of the local oscillator applied to the base of the particular transistor T5–T8 and the input voltage end, $V_{in+}$ or $V_{in-}$, applied to the particular transistor's emitter. Specifically, the current on the collector of transistor T5 is the mixture of local oscillator in-phase current component, I, with the positive end, $V_{in+}$, of the input voltage, the current on the collector of transistor T6 is the mixture of the local oscillator complementary in-phase signal, I__, with the positive end, $V_{in+}$, of the input voltage. The current on the collector of transistor T7 is the mixture of the local oscillator complementary in-phase signal, I__, with the negative end, $V_{in-}$, of the input voltage. Finally, the current through the collector of transistor T8 is the mixture of the local oscillator in-phase current, I, with the negative end, $V_{in-}$, of the input voltage. An analogous situation exists for transistors T9–T12, except that the two ends of the input voltage are being mixed with the quadrature signal component, Q, and its complement, Q__.

Thus, the output, $I_{out}$, in FIG. 2 is the combined signals at the collectors of transistors T5 and T7, the $I_{out\_}$ signal is the combination of the collector currents on transistors T6 and T8, the $Q_{out}$ signal is the combination of the collector currents on transistors T9 and T11 and the $Q_{out\_}$ signal is the combination of the collector currents of transistors T10 and T12. These four signals contain frequency components at the sum and difference frequencies, $F_{in} \pm F_{lo}$. As noted above, the four signals may be combined in a manner well known in the art so as to cancel out one of the side-bands of a double side-band input signal.

Figure 4:
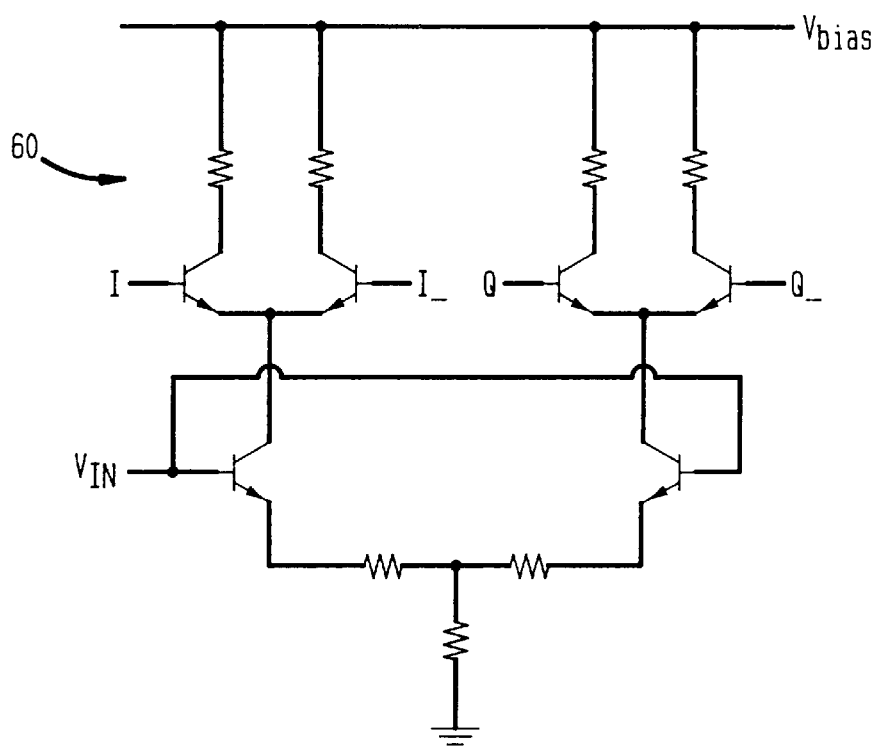
FIG. 4 is a circuit diagram of a conventional single balanced quadrature mixer which might be used in the single side-band mixer of FIG. 2.

FIG. 4 shows a single-ended conventional quadrature mixer corresponding to the architecture of the double balanced quadrature mixer shown in FIG. 3 and should be self explanatory from the description above in connection with FIG. 3.

Figure 5:
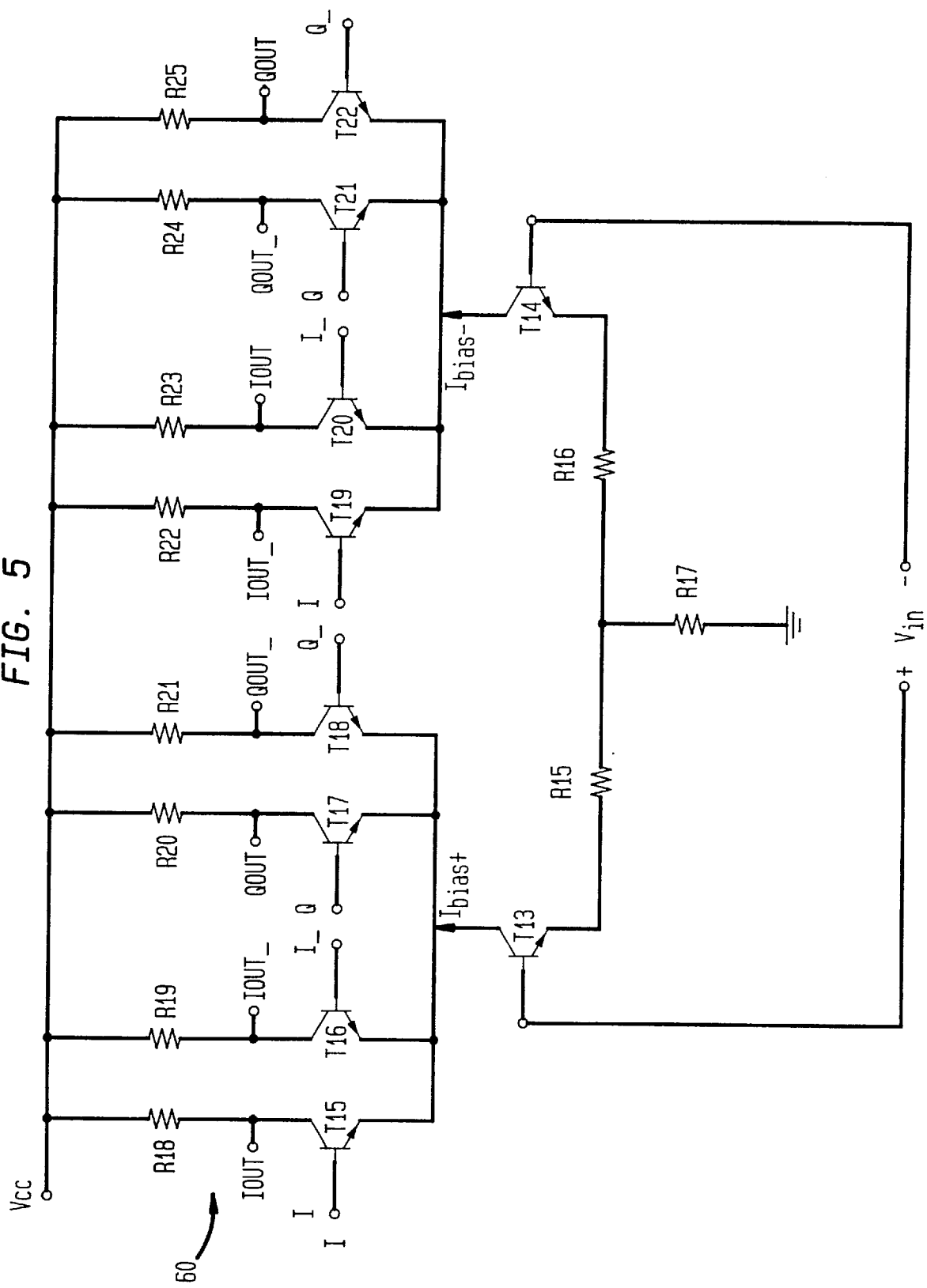
FIG. 5 is a circuit diagram of a dual balanced quadrature mixer cell in accordance with the present invention.

FIG. 5 is a circuit diagram of a quadrature mixer in accordance with the present invention for a dual balanced input signal. The input voltage, $V_{in}$, is applied at the bases of transistors T13 and T14. The emitters of transistors T13 and T14 are coupled to ground through impedances R15, R16 and R17, as shown. All impedances herein may be resistors, inductors, or other circuit impedances.

The collector of transistor T13 is coupled to the emitters of transistors T15, T16, T17 and T18. The collector of transistor T14 is coupled to the emitters of transistors T19, T20, T21 and T22. The collectors of transistors T15–T22 are coupled through impedances R18–R25, respectively, to voltage rail $V_{cc}$.

The bases of transistors T15–T22 are coupled to the various orthogonal components of the local oscillator signal, as shown. Particularly, the bases of transistors T15 and T20 are coupled to the in-phase component I of the local oscillator, the bases of transistors T16 and T19 are coupled to the complement of the in-phase component I_ of the local oscillator, the bases of transistors T17 and T22 are coupled to the quadrature component Q of the local oscillator and the bases of transistor T18 and T21 are coupled to the complement of the quadrature component Q_ of the local oscillator.

The lower pair of transistors T13 and T14, along with the impedances R15, R16 and R17, act as a voltage to current converter; converting the dual balanced input voltage, $V_{in}$, into a pair of bias currents, $I_{bias+}$ and $I_{bias-}$. Specifically, transistor T13 converts the positive end of the input voltage, $V_{in+}$, into bias current $I_{bias+}$, while transistor T14 converts the negative end of the input voltage, $V_{in-}$, into bias current, $I_{bias-}$. Current $I_{bias+}$ is split four ways and provided to the emitters of transistors T15, T16, T17, and T18. Current $I_{bias-}$ is split four ways and provided to the emitters of transistors T19, T20, T21, and T22.

Thus, the outputs of the mixer, $I_{out}$, $I_{out\_}$, $Q_{out}$, and $Q_{out\_}$ (see, e.g., FIG. 2) are obtained from the collectors of transistors T15–T22. Specifically, $I_{out}$ is obtained by combining the signals at the collectors of transistors T15 and T20, $I_{out\_}$ is obtained by combining the collector currents on transistors T16 and T19, $Q_{out}$ is obtained by combining the collector currents of transistors T17 and T22 and $Q_{out\_}$ is obtained by combining the collector currents of transistors T18 and T21. The four output signals may be combined in a manner so as to cancel out one of the two side-bands of a double side-band input signal, while leaving the other sideband, as previously explained. The combined output can then be passed through an intermediate frequency filter as described above in connection with FIG. 2 to pull out a frequency downshifted version of the input signal with one of the side bands eliminated.

The use of a single transistor, T13, in the voltage-to-current conversion portion of the mixer (the lower portion in FIG. 5), rather than a pair of transistors, T1 and T2, as in the prior art, is advantageous. Specifically, the input voltage is not split between two transistors and, therefore, the sensitivity of the circuit to the input voltage is increased. Also, it reduces the number of circuit components and connections.

It can be seen that the present invention reduces the number of transistors necessary to implement a quadrature mixer. In particular, whereas the prior art double balanced quadrature mixer requires four lower transistors, the present invention requires only two. Further, the circuit will have better linearity and/or require less current for operation due to the fact that it employs only a single voltage-to-current transistor for each end of the input signal, rather than dual lower transistors driving two pairs of mixer transistors separately. Even further, the circuit will have better balance on the input signal because the input signal is provided to the two related pairs of mixer transistors in the upper portion of the circuit through the same lower path rather than through two different transistor paths as in the prior art.

Even further, in certain applications, the present invention will be less affected by transistor noise than quadrature mixers of the prior art. For instance, when used in a circuit in which the outputs of the mixer are phase shifted and combined, as is the case when used in an SSB mixer to eliminate one of the sidebands of a double side band signal, the outputs can be combined to reject transistor noise at the image reject frequency from the lower drive transistor(s). Particularly, using the single ended embodiment of FIG. 6 as an example, a single drive transistor provides the same bias current to all four upper transistors. Accordingly, if the output signals of the quadrature mixer are phase shifted and combined in certain combinations, the transistor noise of the lower drive transistor will cancel itself out due to the inversion (caused by the phase shift) of one of the combined outputs relative to another. For instance, if the collector current of transistor T24 is phase shifted 0° and combined with the 90° phase shifted collector current of transistor T26, and the collector current of transistor T25 is phase shifted 0° and combined with the 90° phase shifted collector current of transistor T27, not only will one of the sidebands be eliminated by self cancellation, but so will any transistor noise of the drive transistor resulting from the image rejected sideband signal. The aforementioned cancellation of the drive transistor noise will occur only in those embodiments in which the collector currents are combined in a specific manner. However, it should be noted that, in quadrature mixers of the prior art, such as illustrated by FIG. 4, drive transistor noise cancellation is not even possible since the bias currents into the upper transistors are provided by two different drive transistors having uncorrelated noise.

Figure 6:
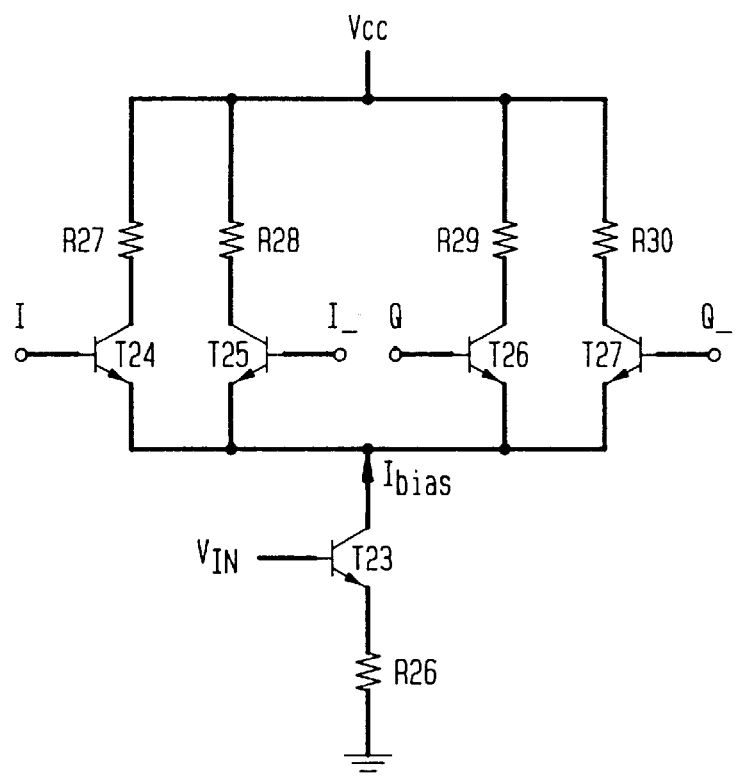
FIG. 6 is a circuit diagram of a single balanced quadrature mixer in accordance with the present invention.

FIG. 6 is a circuit diagram showing the quadrature mixer of the present invention for a single-ended input embodiment. As shown, a single lower transistor T23 converts the input voltage $V_{in}$ to a bias current $I_{bias}$ at the collector of transistor T23. The base of transistor T24 is coupled to the in-phase component of the local oscillator, the base of transistor T25 is coupled to the complement of the in-phase component of the local oscillator, the base of transistor T26 is coupled to the quadrature component of the local oscillator, and the base of transistor T27 is coupled to the complement of the quadrature component of the local oscillator. Each of transistors T24–T27 is coupled through an impedance R27–R30, respectively, to the $V_{cc}$ voltage rail. The emitters of transistor T24–T26 each are supplied with the bias current. As explained above with respect to the dual balanced embodiment, the collectors of the transistors T24–T27 each carry a current proportional to the product of the orthogonal component of the local oscillator applied to the base of the respective transistor with the bias current. Accordingly, $I_{out}$ is supplied at the collector of transistor T24, $I_{out\_}$ is supplied at the collector of transistor T25, $Q_{out}$ is supplied at the collector of T26 and $Q_{out\_}$ is supplied at the collector of T27.

Figure 7:
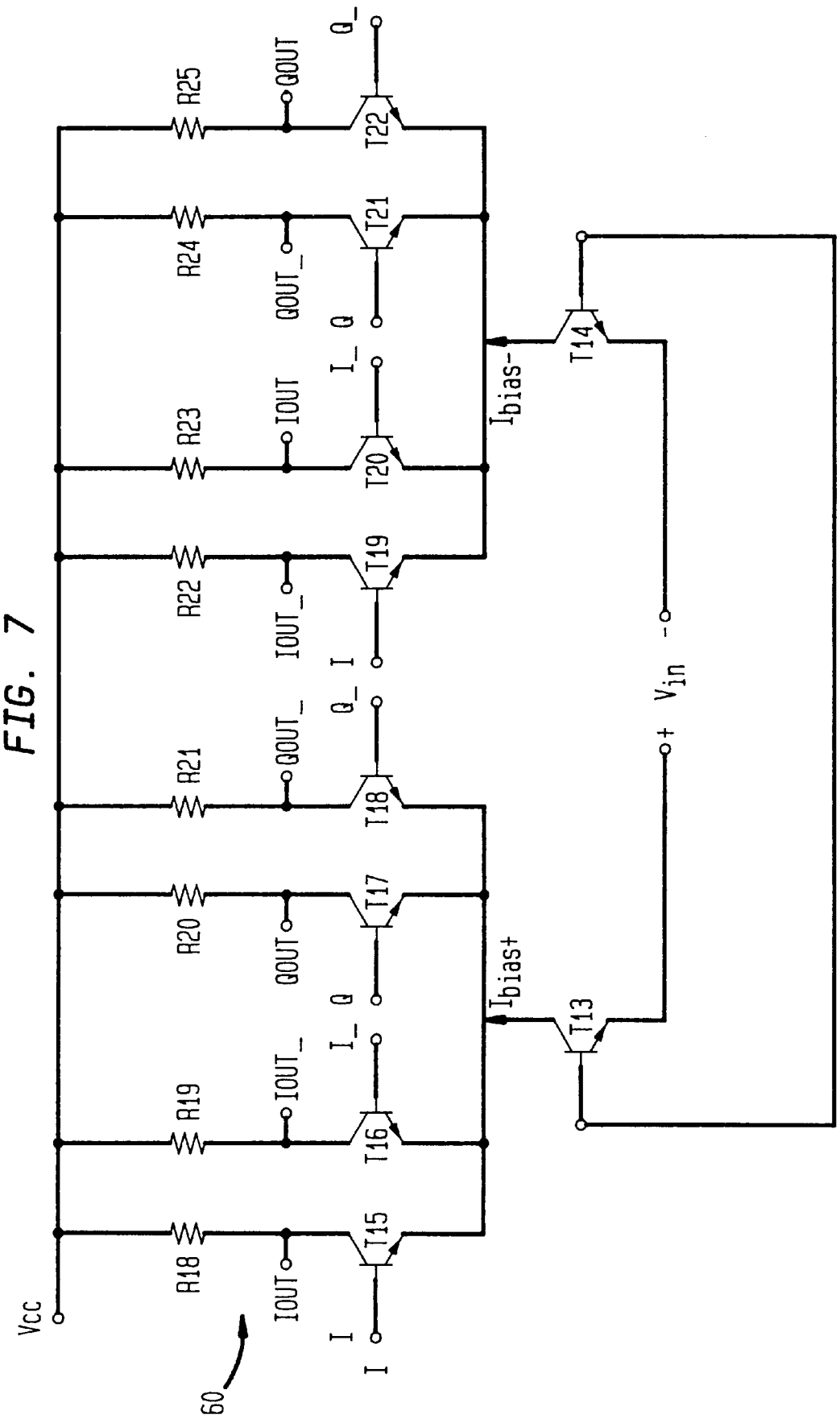
FIG. 7 is a circuit diagram of a dual balanced quadrature mixer cell in accordance with a second embodiment of the invention.
Figure 8:
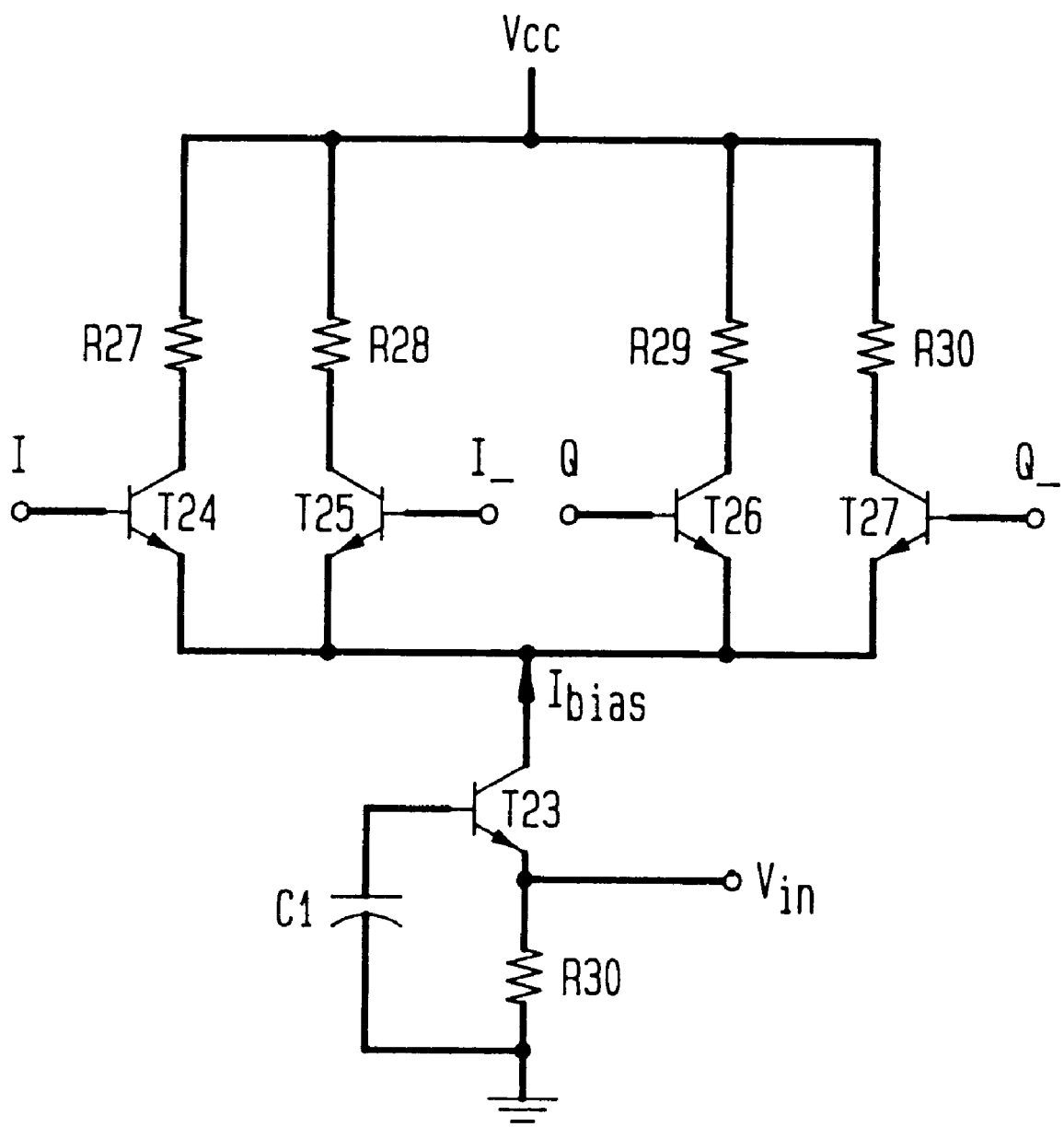
FIG. 8 is a circuit diagram of a single balanced quadrature mixer in accordance with a second embodiment of the present invention.

As is well known in the art, the input signal may be coupled in to a quadrature mixer through a common base configuration, in which the signal is applied through the emitter of the drive transistor(s). FIG. 7 shows a second dual balanced embodiment of the invention in which the input signal is applied to the emitter of the drive transistors. The circuit components are substantially the same as the embodiment shown in FIG. 5. The input signal, however, is applied to the emitters of transistors T13 and T14 and the resistors R15, R16, and R17 are eliminated. Also, the bases of the drive transistors T13 and T14 are coupled together. FIG. 8 shows a second single balanced embodiment of the invention in which the input signal is applied to the emitter of the drive transistor. All of the circuit components are essentially identical to the embodiment shown in FIG. 6. The input signal, however, is applied to the emitter of the drive transistor T23 and the base of the drive transistor T23 is coupled to ground through a capacitance C1.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. For instance, the invention has been described in connection with embodiments employing bipolar junction transistors. However, it should be understood that the invention also may be constructed with FET, MOSFET or other transistor types. Accordingly, the foregoing description is by way of example only, and not limiting. The invention is limited only as defined in the following claims and equivalents thereto.

I claim:

1. A single side band mixer comprising:
   a phase splitter coupled to receive a local oscillator signal and generate therefrom an in phase component, a complementary in phase component, a quadrature component, and a complementary quadrature component of said local oscillator signal;
   a quadrature mixer comprising;
      a first transistor coupled to receive an input voltage signal and having a current output signal representative of a dual side band input signal;
      a second transistor coupled to said current signal and to an in phase component of a local oscillator signal;
      a third transistor coupled to said current signal and to a complementary in phase component of said local oscillator signal;
      a fourth transistor coupled to said current signal and to a quadrature component of said local oscillator signal;
      a fifth transistor coupled to said current signal and to a complementary quadrature component of said local oscillator signal; and
      said second through fifth transistors generating output signals representing the product of said current output signal of said first transistor with said in phase, complementary in phase, quadrature and complementary quadrature local oscillator signals, respectively;
   a first phase shifter coupled to receive said output signals of said second and third transistors for shifting the phase of said output signals and having first and second outputs comprising phase shifted versions of said output signals of said second and third transistors;
   a second phase shifter coupled to receive said output signals of said fourth and fifth transistors for shifting the phase of said output signals and having first and second outputs comprising phase shifted versions of said output signals of said fourth and fifth transistors; and
   a summation circuit, coupled to receive said output signals of said first and second phase shifters, for summing said outputs of said first and second phase shifters so as to cancel one sideband of said input signal.

2. An apparatus as set forth in claim 1 wherein said first transistor has a base terminal coupled to said input voltage and an emitter terminal coupled to ground.

3. An apparatus as set forth in claim 2 wherein said emitter terminal is coupled to ground through a first impedance.

4. An apparatus as set forth in claim 1 wherein said first transistor has an emitter terminal coupled to said input voltage and a base terminal coupled to ground.

5. An apparatus as set forth in claim 4 wherein said base terminal of said first transistor is coupled to ground through a capacitance.

6. An apparatus as set forth in claim 1 wherein said second through fifth transistors each have emitter terminals coupled to receive said current output of said first transistor and a base terminal coupled to said respective components of said local oscillator signal.

7. An apparatus as set forth in claim 6 wherein said second through fifth transistors have collector terminals on which said output signals are generated.

8. An apparatus as set forth in claim 7 wherein said collector terminals of said second through fifth transistors are coupled to a fixed voltage through second through fifth impedances, respectively.

9. An apparatus as set forth in claim 8 wherein said voltage input signal is a double side band signal and said outputs of said second through fifth transistors are combined so as to cancel one side band of said double side band voltage input signal.

* * * * *